(12) United States Patent
Hung

(10) Patent No.: US 7,511,584 B2
(45) Date of Patent: Mar. 31, 2009

(54) VOLTAGE CONTROLLED OSCILLATOR CAPABLE OF OPERATING IN A WIDE FREQUENCY RANGE

(75) Inventor: Kenneth Wai Ming Hung, Pak Shek Kok (HK)

(73) Assignee: Smartech Worldwide Limited, Hong Kong (CN)

( * ) Notice: Subject to any disclaimer, the term of this patent is extended or adjusted under 35 U.S.C. 154(b) by 84 days.

(21) Appl. No.: 11/779,341

(22) Filed: Jul. 18, 2007

(65) Prior Publication Data

US 2009/0021313 A1 Jan. 22, 2009

(51) Int. Cl.
*H03B 27/00* (2006.01)
(52) U.S. Cl. .......................................... 331/57; 331/185
(58) Field of Classification Search ............ 331/117 FE, 331/167, 177 V, 57, 185
See application file for complete search history.

(56) References Cited

U.S. PATENT DOCUMENTS

| 6,445,253 | B1 | 9/2002 | Talbot |
| 6,617,933 | B2 | 9/2003 | Ito |
| 6,686,806 | B2 | 2/2004 | Dufour |
| 6,842,079 | B2 | 1/2005 | Ingino |
| 6,867,658 | B1 * | 3/2005 | Sibrai et al. .................. 331/185 |
| 6,900,703 | B2 | 5/2005 | Garvin |
| 6,943,608 | B2 | 9/2005 | Kelkar |
| 7,030,669 | B2 | 4/2006 | Hulfachor |
| 7,071,789 | B2 | 7/2006 | Gu |

* cited by examiner

*Primary Examiner*—Arnold Kinkead
(74) *Attorney, Agent, or Firm*—Xin Wen

(57) ABSTRACT

A voltage controlled oscillator includes a first NMOS transistor having a base terminal configured to receive an input signal INP and a drain terminal connected to an output node OUTN, a second NMOS transistor having a base terminal configured to receive an input signal INN and a drain terminal connected to an output node OUTP, a third NMOS transistor having a source terminal connected to a low voltage supply VSS and a drain terminal connected to source terminals of the first NMOS transistor and the second NMOS transistor. A first PMOS transistor includes a base terminal connected to the output node OUTP and a drain terminal connected to the output node OUTN. A second PMOS transistor includes a base terminal connected to the output node OUTN and a drain terminal connected to the output node OUTP.

19 Claims, 4 Drawing Sheets

US 7,511,584 B2

VOLTAGE CONTROLLED OSCILLATOR CAPABLE OF OPERATING IN A WIDE FREQUENCY RANGE

BACKGROUND

The present invention relates to a voltage controlled oscillator.

Voltage controlled oscillator (VCO) is widely being used in various fields and is particularly useful in phase locked loop (PLL). PLL is usually used as clock generator with VCO being the main component for frequency generation. Microcontrollers or microprocessors often include embed PLL-based clock generators to generate clock signals at different frequencies. VCO therefore plays an important role for frequency variable oscillations. Wider clock-frequency range can allow the more flexible operations in the microcontrollers or microprocessors and broader applications.

VCO is implemented as a series of delay cells with outputs from previous stage connected to the inputs of the next stage. The number of delay stages can be either odd or even, and depend on the design of delay cells. The oscillation frequency depends on the total delay from the delay cells and can be controlled by an external voltage. Larger delays correspond to lower the oscillation frequencies, while smaller delays correspond to higher oscillation frequencies.

A conventional cross-coupled oscillator 100, shown in FIG. 1, includes a pair of NMOS transistors 103A, 103B with their sources connected to a low voltage supply VSS (or the ground). A pair of PMOS transistors 102A, 102B is respectively connected between a positive voltage supply VDD and NMOS transistors 103A, 103B. The base nodes of the NMOS transistors 103A, 103B can respectively receive two input signals INP and INN. The base nodes of the PMOS transistors 102A, 102B are cross-coupled to the drain nodes of the NMOS transistors 103A, 103B wherein two output signals OUTN and OUTP can be provided. The cross-coupled oscillator 100 can provide full rail-to-rail oscillation signals (i.e. with voltage magnitudes reaching almost VDD to almost VSS) that are relatively insensitive to noise in VDD and VSS. The cross-coupled oscillator 100 is self-oscillating at fixed oscillation frequency without being controlled by an external signal.

Microcontrollers or microprocessors are typically required to operate from several MHz to over hundreds of MHz. This frequency large range can be difficult to achieve for conventional oscillators. There is therefore a need for an oscillator capable of operating over a wide frequency range.

SUMMARY

In a general aspect, the present invention relates to a voltage controlled oscillator that includes a first NMOS transistor having a base terminal configured to receive an input signal INP and a drain terminal connected to an output node OUTN; a second NMOS transistor having a base terminal configured to receive an input signal INN and a drain terminal connected to an output node OUTP; a third NMOS transistor having a source terminal connected to a low voltage supply VSS and a drain terminal connected to source terminals of the first NMOS transistor and the second NMOS transistor; a first PMOS transistor having a base terminal connected to the output node OUTP and a drain terminal connected to the output node OUTN; and a second PMOS transistor having a base terminal connected to the output node OUTN and a drain terminal connected to the output node OUTP, wherein the output node OUTN and the output node OUTP that can output at least one oscillation signal.

In another general aspect, the present invention relates to a voltage controlled oscillator that includes a first NMOS transistor having a base terminal configured to receive an input signal INP and a drain terminal connected to an output node OUTN; a second NMOS transistor having a base terminal configured to receive an input signal INN and a drain terminal connected to an output node OUTP; a third NMOS transistor having a source terminal connected to a low voltage supply VSS and a drain terminal connected to source terminals of the first NMOS transistor and the second NMOS transistor, wherein the third NMOS transistor has a base terminal configured to receive an enable signal EN; a first PMOS transistor having a base terminal connected to the output node OUTP, a drain terminal connected to the output node OUTN, and a source terminal connected to a high voltage supply VDD; a second PMOS transistor having a base terminal connected to the output node OUTN, a drain terminal connected to the output node OUTP, and a source terminal connected to the VDD, wherein the output node OUTN and the output node OUTP are configured to output at least one oscillation signal; a fourth NMOS transistor coupled between the output node OUTN and VSS; a fifth NMOS transistor coupled between the output node OUTP and VSS, wherein base terminals of the fourth NMOS transistor and the fifth NMOS transistor are configured to receive a voltage control signal VCTRL; a first capacitor connected between the fourth NMOS transistor and VSS; and a second capacitor connected between the fifth NMOS transistor and VSS.

In yet another general aspect, the present invention relates to a voltage controlled oscillator that includes a converter comprising a first input INN, a second input INP, and an output FOUT, wherein the converter is configured to output an oscillation signal at the output FOUT; N serially connected delay cells, wherein N is an integer larger than 1. The N serially connected delay cells include an Nth delay cell comprising a first output OUTN connected to the first input INN of the converter and a second output OUTP connected to the second input INP of the converter; an (N−1)th delay cell comprising a first output OUTN connected to the first input INN of the Nth delay cell and a second output OUTP connected to the second input INP of the Nth delay cell; and a first delay cell comprising a first output OUTN connected to the first input INN of the second delay cell and a second output OUTP connected to the second input INP of the second delay cell, the first delay cell further comprising a first input INN connected to the second output OUTP of the Nth delay cell and a second input INP connected to the first output OUTN of the Nth delay cell. At least one of the N serially connected delay cells includes a first NMOS transistor having a base terminal configured to receive an input signal INP and a drain terminal connected to a first output OUTN associated with the one of the N serially connected delay cells; a second NMOS transistor having a base terminal configured to receive an input signal INN and a drain terminal connected to a second output OUTP associated with the one of the N serially connected delay cells; a third NMOS transistor having a source terminal connected to a low voltage supply VSS and a drain terminal connected to source terminals of the first NMOS transistor and the second NMOS transistor; a first PMOS transistor having a base terminal connected to the first output OUTP associated with the one of the N serially connected delay cells and a drain terminal connected to the second output OUTN associated with the one of the N serially connected delay cells; and a second PMOS transistor having a base terminal connected to the second output OUTN associated with the one of the N serially connected delay cells, and a drain terminal connected to the first output OUTP associated with the one of the N serially connected delay cells, wherein the output node OUTN and the output node OUTP associated with the one of the N serially connected delay cells are configured to output at least one oscillation signal.

Implementations of the system may include one or more of the following. Source terminals of the first PMOS transistor and the second PMOS transistor can be connected to a high voltage supply VDD. The voltage controlled oscillator can further include a fourth NMOS transistor coupled between the output node OUTN and VSS, wherein the fourth NMOS transistor includes a base terminal configured to receive a voltage control signal VCTRL; and a first capacitor connected between the fourth NMOS transistor and VSS. An increase in the voltage of the voltage control signal VCTRL, can decrease the frequency of the oscillation signal. The voltage controlled oscillator can further include a fifth NMOS transistor coupled between the output node OUTP and VSS, wherein the fifth NMOS transistor includes a base terminal configured to receive a voltage control signal VCTRL; and a second capacitor connected between the fifth NMOS transistor and VSS. The voltage controlled oscillator can further include a third PMOS transistor having a base terminal configured to receive a voltage control signal VCTRL and a source terminal connected to a high voltage supply VDD; a first diode-connected PMOS transistor coupled between a drain terminal of the third PMOS transistor and the output node OUTN; and a second diode-connected PMOS transistor coupled between the drain terminal of the third PMOS transistor and the output node OUTP. A base terminal of the third NMOS transistor is configured to receive an enable signal EN. The voltage controlled oscillator can further include a resistor connected between the output node OUTN and the output node OUTP.

Embodiments may include one or more of the following advantages. An advantage of the disclosed voltage controlled oscillators is that they can provide oscillation frequency ranges wider than conventional oscillators while providing a high voltage gain. The output oscillation signals produced by the disclosed oscillator can swing almost from the low supply voltage to the high supply voltage (i.e. rail-to-rail). The wider oscillation frequency ranges can provide flexibility and allow the disclosed oscillators to be more widely used in different applications. Another advantage of the disclosed voltage controlled oscillators is that the differential structure of the oscillators can provide immunity to power and ground noise. The disclosed voltage controlled oscillator can also be implemented by circuit layouts much simpler than some convention oscillators that require complex analog circuits or comparators to accomplish the differential-to-single ended function.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles of the invention.

DETAILED DESCRIPTION

Figure 1:
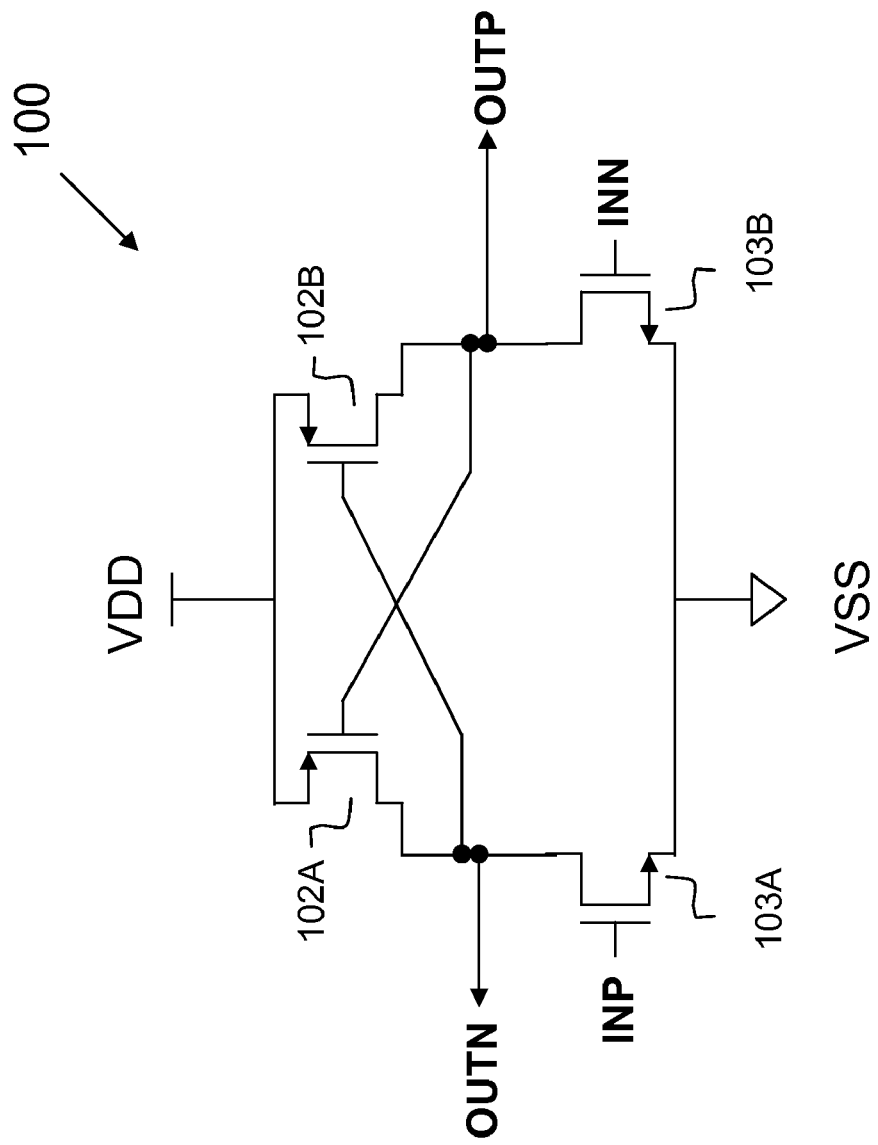
FIG. 1 illustrates a conventional cross-coupled oscillator without voltage control.
Figure 2:
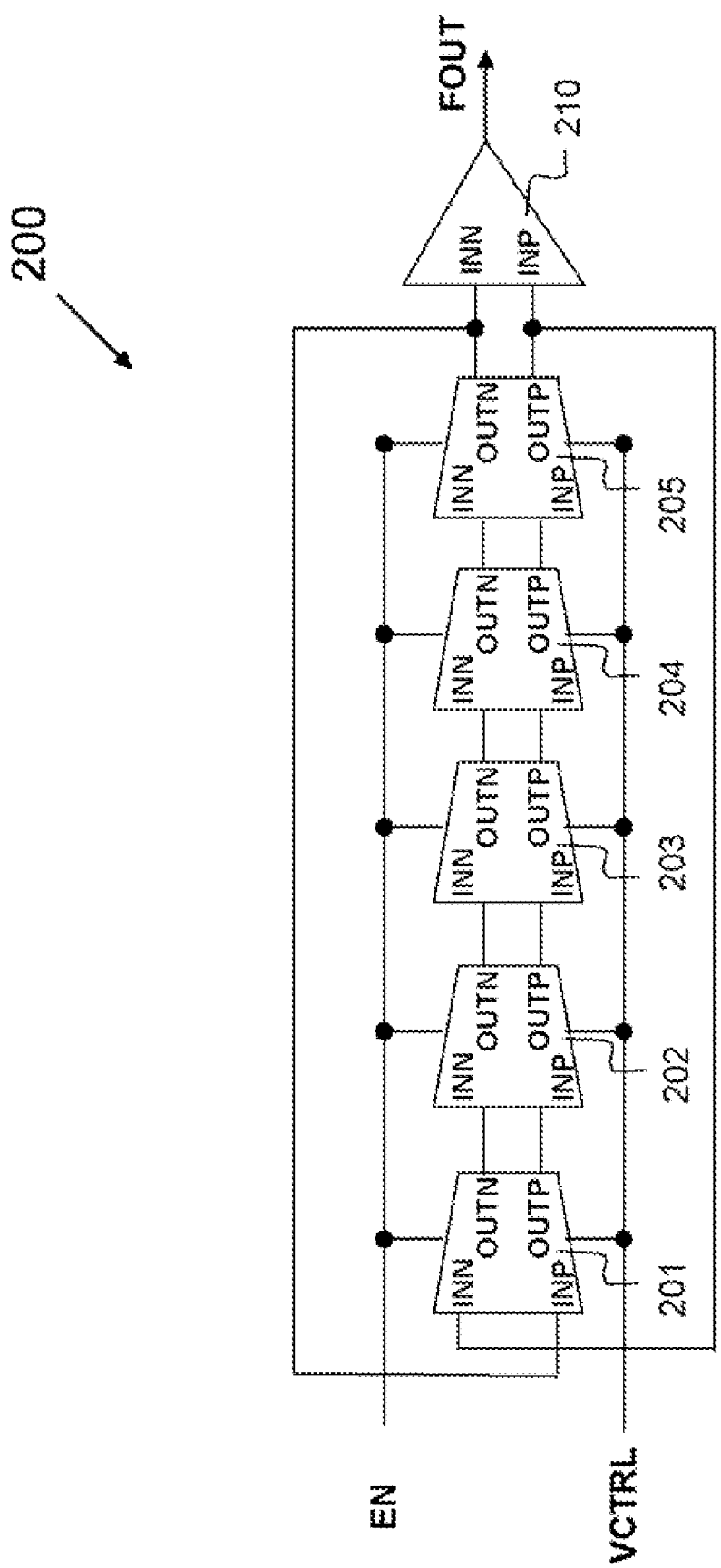
FIG. 2 illustrates an exemplified voltage controlled oscillator including a multi-stage delay cell in accordance with the present application.

A voltage controlled oscillator (VCO) 200, referring to FIG. 2, can include serial connected delay cells 201-205 and a differential-to-single-ended converter 210. Each of the delay cells 201-205 includes two differential-ended inputs INP and INN, two differential-ended outputs OUTP and OUTN, one control voltage signal VCTRL, and one enable signal EN. The VCTRL signal is used to supply control voltage to vary the delay of each stage 201-205, which in turn can vary the oscillation frequency at the output (FOUT). The enable signal EN is used to kick-start the VCO 200 from a power-down mode. The enable signal EN can be active at logic high. An exemplified implementation for the delay cells 201-205 is described below in associate with oscillator 300 in FIG. 3.

The delay cells 201-205 are serially connected. The outputs OUTP and OUTN of the delay cell 201 are respectively connected to the inputs INP and INN of the delay cell 202. The outputs OUTP and OUTN of the delay cell 202 are respectively connected to the inputs INP and INN of the delay cell 203, and so on. Finally, the output OUTP of the delay cell 205 is connected back to the input INN of the delay cell 201. The output OUTN of the delay cell 205 is connected back to the input INP of the delay cell 201. The outputs of the series of delay cells 201-205 are thus inverted and fed to the inputs of the first delay cell, which provides a self-oscillation mechanism. The differential-ended signals OUTN and OUTP from the delay cell 205 are sent to the converter 210 and are converted by the converter 210 to a single-ended oscillation output signal FOUT.

The oscillation frequency of the output signal FOUT is inversely proportional to the total delays of the delay cells 201-205. The total delay is the sum of the delays in the individual delay cells 201-205. A long total delay leads to low frequency oscillation and a short total delay leads to a high frequency oscillation. The delay at each of the delay cells 201-205 can be controlled by the VCTRL. For VCO with a negative voltage gain, an increase in VCTRL can increase the delay of the delay cell (by for example decreasing the sourcing current to the oscillator, as described below in conjunction with oscillator 300), thus decreasing the oscillation frequency of the output signal of the delay cells 201-205. For a positive voltage gain VCO, an increase in VCTRL can decrease the delay of the delay cell, thus increasing the oscillation frequency of the output signal of the delay cells 201-205.

The VCO 200 can have a negative voltage gain or a positive voltage gain. For a positive voltage gain, the oscillation frequency increases with the voltage of the control signal VCTRL. For a negative voltage gain, the oscillation frequency decreases with the voltage of the control signal VCTRL. For illustrating purposes, a negative voltage gain is used in the present example.

Figure 3:
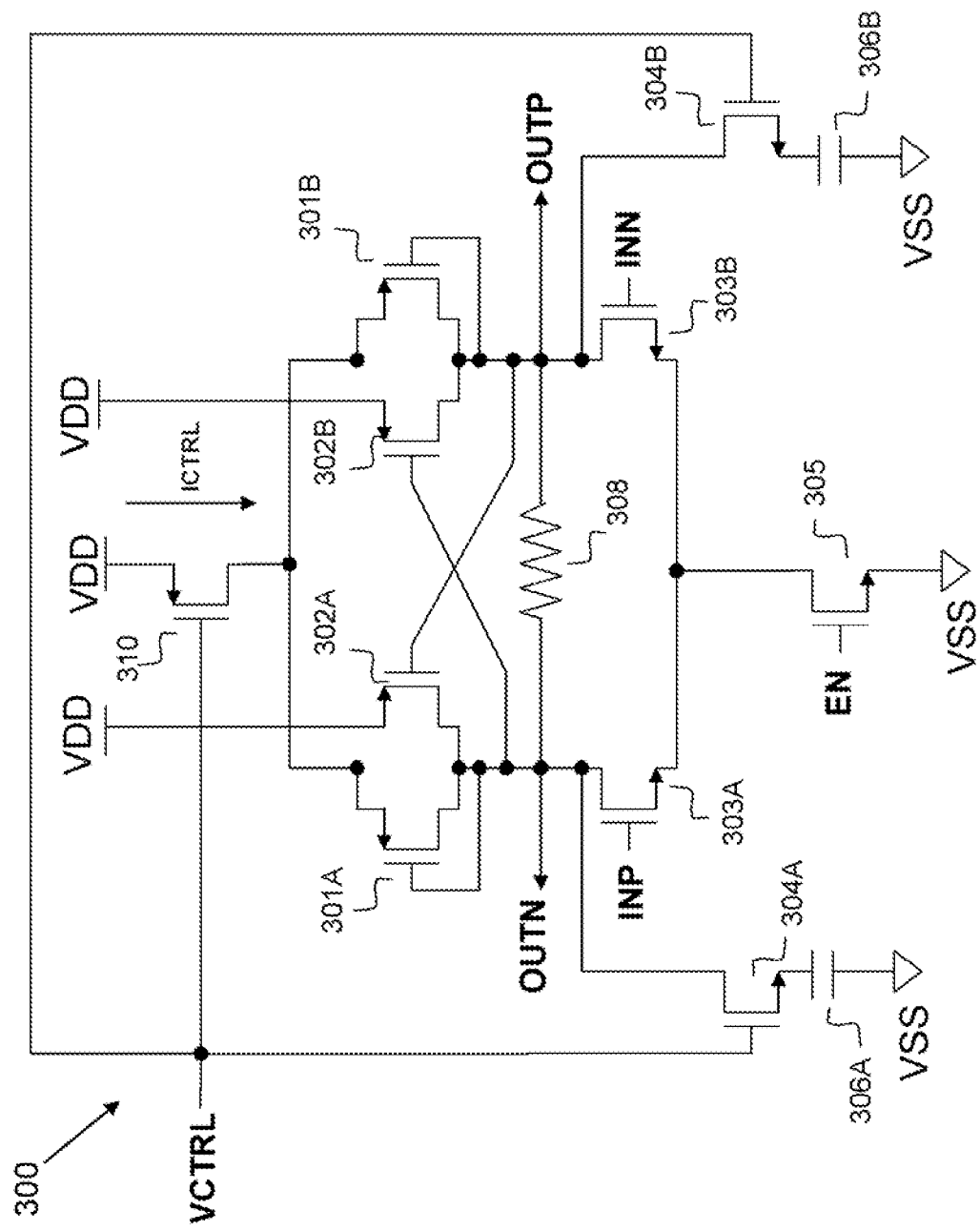
FIG. 3 illustrates an exemplified construction of the delay cell of FIG. 2.

In accordance to the present specification, the frequency range of the output signals (FOUT) of the VCO 200 can be expanded by an improved oscillator circuit compatible with the delay cells 210-205. FIG. 3 illustrates an oscillator 300 compatible with the delay cells 201-205. The oscillator 300 includes a pair of NMOS transistors 303A, 303B with their sources connected to the drain of another NMOS transistor 305. The NMOS transistor 305 includes a source node connected to the low voltage supply VSS (or the ground) and a base node adapted to receive an input enable signal EN. When EN is at logic L, the oscillator 300 is disabled and no oscillation is to occur. When EN is at logic H, the oscillator is enabled and can produce an oscillation signal.

The base nodes of the NMOS transistors 303A, 303B can respectively receive two input signals INP and INN. A pair of PMOS transistors 302A, 302B is respectively connected between a positive voltage supply VDD and the drain nodes of the NMOS transistors 303A, 303B. The base nodes of the PMOS transistors 302A, 302B are cross-coupled to the drain nodes of the NMOS transistors 303A, 303B where two out-of-phase output signals OUTN and OUTP can be provided. The cross-coupled oscillator circuit block including the NMOS transistors 303A, 303B and the NMOS transistors 303A, 303B can oscillates at a fixed frequency at the lower limit of the oscillation frequency range of the limit for the cross-coupled oscillator 300.

The oscillator 300 can also include two diode-connected PMOS transistors 301A and 301B connected between the drain of PMOS transistor 310 and the output nodes OUTN and OUTP, respectively. The source of the PMOS transistor 310 is connected to VDD. The base of the PMOS transistor 310 can receive an external voltage control signal VCTRL. The PMOS transistor 310 can source a current ICTRL into the two diode-connected PMOS transistors 301A and 301B under the control of VCTRL.

The oscillator 300 can also include two NMOS transistors 304A and 304B that function as voltage controlled resistors. The bases of the NMOS transistors 304A and 304B are both connected to the external voltage control VCTRL. The drains of the NMOS transistors 304A and 304B are respectively connected to the output nodes OUTN and OUTP. The sources of the NMOS transistors 304A and 304B are coupled to the top plates of the capacitors 306A and 306B respectively. The NMOS transistors 304A and 304B and their associated capacitors 306A and 306B can provide variable delays to the output nodes OUTN and OUTP according to different VCTRL voltage depending on the level of turn-on of the NMOS transistors 304A and 304B.

The NMOS transistors 303A and 303B can determine the charging and discharging times for the capacitors 306A, 306B. The more current diverted into the capacitors 306A and 306B by the NMOS transistors 304A and 304B, the longer it takes to discharge the capacitors 306A, 306B; the longer the delays of the oscillator 300.

During a kick-start, EN is high. Assuming VCTRL starts at the highest voltage potential, VDD, the PMOS transistor 310 is shut off, preventing currents from flowing to the nodes OUTP and OUTN through the diode-connected PMOS transistors 301A and 301B. (The disclosed oscillator can function similarly if VCTRL starts at close to VSS.) The high VCTRL can also fully turn on the NMOS transistors 304A and 304B, thus allowing currents from OUTP and OUTN to go through the capacitors 306A and 306B to charge/discharge the capacitors 306A and 306B.

Figure 4:
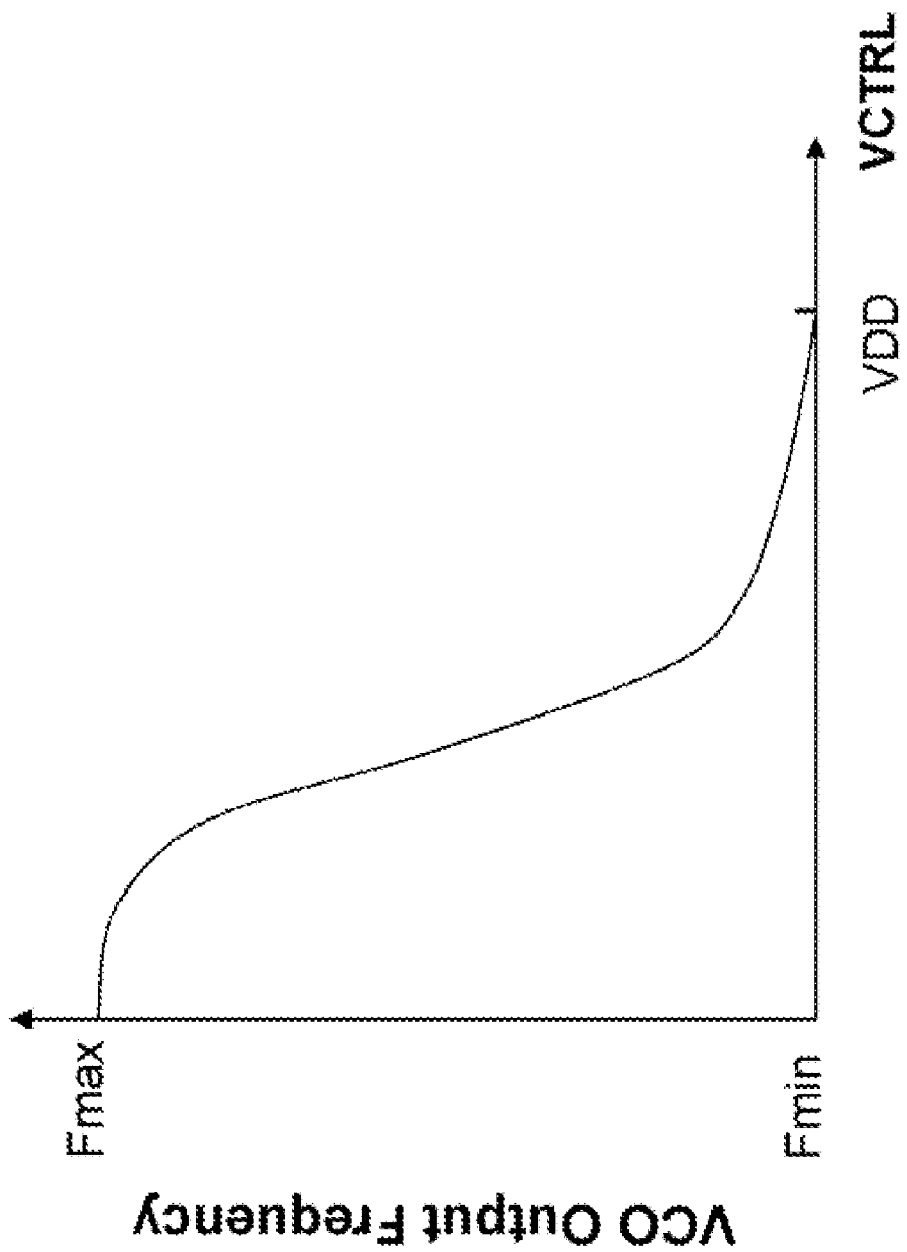
FIG. 4 illustrates the relationship between the oscillation frequency and the control voltage in the voltage controlled oscillator in FIG. 2.

As shown in FIG. 4, the oscillator 300 oscillates at its lowest possible frequency, Fmin when VCTRL is near VDD. When VCTRL is near VDD, the NMOS transistors 304A and 304B are fully on and the PMOS transistor 310 is fully off. Thus no extra bias current is supplied by the PMOS transistor 310. The currents are only supplied by the PMOS transistors 302A and 302B. Portions of the currents are used to charge or discharge the capacitors 306A and 306B until the voltage level at OUTP and OUTN increases or decreases enough to switch voltage logic levels of at OUTP and OUTN. The delays are therefore the longest and the oscillation frequency the lowest when VCTRL is near VDD.

The delay times are respectively determined by VCTRL which controls how hard the NMOS transistors 304A and 304B are turned on. The output currents at the nodes OUTP and OUTN include two portions: a first portion to charge/discharge the parasitic capacitances of the PMOS transistors 301A, 302A, 301B, 302B. The second portion is to charge/discharge the capacitors 306A and 306B. The more effective capacitance at the nodes OUTP and OUTN, the more time it takes to charge/discharge the nodes OUTP and OUTN, thus the longer the delay time. The effective capacitances of the capacitors 306A, 306B depend on how hard the NMOS transistors 304A and 304B are turned on. The harder the NMOS transistors 304A and 304B are turned on, the larger the effective capacitances seen at the nodes OUTP and OUTN, thus the longer the delay time.

When VCTRL decreases, the PMOS transistor 310 can be gradually turned on from fully off-state to sub threshold on-state. A current starts to be sourced, with increasing strength, from VDD to the output nodes OUTP and OUTN through the PMOS transistor 310, which increases the current output (thus the current) gain of the oscillator 300. More currents can be supplied to charge/discharge the parasitic, capacitances of the PMOS transistors 301A, 302A, 301B, 302B as well as the capacitors 306A and 306B. Also, as VCTRL, decreases, the NMOS transistors 304A and 304B gradually change from fully turn-on states to partially turn-on states, reducing the currents supplied to the capacitors 306A and 306B and thus decreasing the effective capacitance on the output signals OUTP and OUTN as the capacitors 306A and 306B are less needed for charging and discharging because the parasitic capacitances of the PMOS transistors 301A, 302A, 301B, 302B are more available for charging/discharging more currents. The above described processes of increased current supply and the reduced effective capacitance can both cause the oscillation frequency to increase.

When VCTRL decrease to be equal to the lowest voltage, VSS, the maximum amount of bias current ICTRL is supplied the output nodes OUTP and OUTN respectively through the diode-connected PMOS transistors 301A and 301B, thus providing the maximum currents to charge the parasitic capacitances of the PMOS transistors 301A, 302A, 301B, 302B. At the same time, the NMOS transistors 304A and 304B are completely shut off allowing no current charge or discharge the capacitors 306A and 306B. All the currents are focused to charge/discharge the parasitic capacitances. The output signals OUTN and OUTP are thus not delayed by the discharging of the capacitors 306A and 306B. The oscillator 300 can thus, as shown in FIG. 4, oscillate at its highest possible frequency, Fmax.

As described above, the oscillation frequency of the output signals OUTN and OUTP from the oscillator 300 can depend on the amount of ICTRL generated and the extent of capacitive delay by the capacitors 306A and 306B. Both effects can be controlled by the voltage of VCTRL at the same time, without separate pin control or register control compared with other conventional oscillators. The frequencies of oscillation signals OUTN and OUTP can thus be tuned by controlling the voltage of VCTRL as well as by selecting the impedances and gains of the PMOS transistor 310 and the NMOS transistors 304A and 304B and the capacitances of the capacitors 306A and 306B. As a result, the frequency range of the oscillation signals can be significantly increased comparing to some conventional oscillators.

An additional advantage of the oscillator 300 is that the external control voltage VCTRL can be tuned in a full voltage range from VDD to VSS, which increase the control range of the frequencies of the output oscillation signals. The full voltage control range is an improvement over some conventional oscillators that cease to oscillate when VCTRL exceeds certain threshold voltages, and also, the requirement of start-up circuit to kick start the VCO at VDD or VSS, thus giving flexibility to the start-up circuit because falsely start-up the VCO may result in no oscillation finally.

The output oscillation signals produced by the oscillator 300 can swing almost from the low supply voltage (VSS) to the high supply voltage (VDD) (i.e. rail-to-rail) because the circuit block of the cross-coupled oscillator can operate rail to rail. The additional circuits are used to control the output current to vary the frequency and do not change significantly the voltage magnitudes of the output oscillation signals. When the oscillator 300 is implemented in the serial of delay cells 201-205, the converter 210 can thus receive almost full rail-to-rail oscillation signals, which can maximize the efficiency of the VCO 200 and ease the design of differential-to-single ended converter by providing a large input voltage range.

The disclosed voltage controlled oscillator is applicable, for example, to phase locked loop. Details about phase locked loop and the associated voltage controlled oscillator are disclosed in the commonly assigned pending U.S. patent application Ser. No. 11/690,835, tilted "Charge pump circuit with dynamic current biasing for phase locked loop circuit", filed Mar. 25, 2007, the content of which is incorporated herein by reference.

The disclosed circuits and methods may have one or more of the following advantages. An advantage of the disclosed voltage controlled oscillators is that they can provide oscillation frequency ranges than conventional oscillators while providing a high voltage gain. For example, applications may require a programmable frequency range from 0.5 MHz to 400 MHz, within the VCO frequency needs to cover across different process, voltages, and temperatures in operation for the different applications. The output oscillation signals produced by the disclosed oscillator can swing almost from the low supply voltage to the high supply voltage (i.e. rail-to-rail). The wider oscillation frequency ranges can provide flexibility and allow the disclosed oscillators to be more widely used in different applications.

Another advantage of the disclosed voltage controlled oscillators is that the differential structure of the oscillators can provide immunity to power and ground noise. It is understood that the disclosed circuit and methods are compatible with other configurations of the electronic, components and variations in circuit designs without deviation from the spirit of the present specification. Various forms of resistors, capacitors, transistors, and amplifiers can be used to achieve similar results as described above. The inverters, the Schmitt trigger circuit, and the enable controls can be based on other logic gate designs that are Boolean equivalents and that can perform similar functions. For example, the disclosed VCO is compatible with a positive gain or a negative gain. The disclosed VCO can also include a different number of delay cells from the example described above. In another example, the delay cells in the disclosed VCO can be compatible with other designs such as the above described cross-coupled oscillator 100. Moreover, the delay cells compatible with the disclosed VCO can be single-ended or differential-ended oscillators. The disclosed voltage controlled oscillator can also be implemented by circuit layouts much simpler than some conventional oscillators that require complex analog circuits or comparators to accomplish the differential-to-single ended function.

The present invention is described above with reference to exemplary embodiments. It will be apparent to those skilled in the art that various modifications may be made and other embodiments can be used without departing from the broader scope of the present invention. Therefore, these and other variations upon the exemplary embodiments are intended to be covered by the present invention.

What is claimed is:

1. A voltage controlled oscillator, comprising:
    a first NMOS transistor having a base terminal configured to receive an input signal INP and a drain terminal connected to an output node OUTN;
    a second NMOS transistor having a base terminal configured to receive an input signal INN and a drain terminal connected to an output node OUTP;
    a third NMOS transistor having a source terminal connected to a low voltage supply VSS and a drain terminal connected to source terminals of the first NMOS transistor and the second NMOS transistor;
    a fourth NMOS transistor coupled between the output node OUTN and VSS, wherein the fourth NMOS transistor includes a base terminal configured to receive a voltage control signal VCTRL;
    a first capacitor connected between the fourth NMOS transistor and VSS;
    a first PMOS transistor having a base terminal connected to the output node OUTP and a drain terminal connected to the output node OUTN; and
    a second PMOS transistor having a base terminal connected to the output node OUTN and a drain terminal connected to the output node OUTP, wherein the output node OUTN and the output node OUTP are configured to output at least one oscillation signal.

2. The voltage controlled oscillator of claim 1, wherein source terminals of the first PMOS transistor and the second PMOS transistor are connected to a high voltage supply VDD.

3. The voltage controlled oscillator of claim 1, wherein an increase in the voltage of the voltage control signal VCTRL is configured to decrease the frequency of the oscillation signal.

4. The voltage controlled oscillator of claim 1, further comprising:
    a fifth NMOS transistor coupled between the output node OUTP and VSS, wherein the fifth NMOS transistor includes a base terminal configured to receive a voltage control signal VCTRL; and
    a second capacitor connected between the fifth NMOS transistor and VSS.

5. The voltage controlled oscillator of claim 1, further comprising:
    a third PMOS transistor having a base terminal configured to receive a voltage control signal VCTRL and a source terminal connected to a high voltage supply VDD;
    a first diode-connected PMOS transistor coupled between a drain terminal of the third PMOS transistor and the output node OUTN; and
    a second diode-connected PMOS transistor coupled between the drain terminal of the third PMOS transistor and the output node OUTP.

6. The voltage controlled oscillator of claim 1, wherein a base terminal of the third NMOS transistor is configured to receive an enable signal EN.

7. The voltage controlled oscillator of claim 1, further comprising a resistor connected between the output node OUTN and the output node OUTP.

8. A voltage controlled oscillator, comprising:
   a first NMOS transistor having a base terminal configured to receive an input signal INP and a drain terminal connected to an output node OUTN;
   a second NMOS transistor having a base terminal configured to receive an input signal INN and a drain terminal connected to an output node OUTP;
   a third NMOS transistor having a source terminal connected to a low voltage supply VSS and a drain terminal connected to source terminals of the first NMOS transistor and the second NMOS transistor, wherein the third NMOS transistor has a base terminal configured to receive an enable signal EN;
   a first PMOS transistor having a base terminal connected to the output node OUTP, a drain terminal connected to the output node OUTN, and a source terminal connected to a high voltage supply VDD;
   a second PMOS transistor having a base terminal connected to the output node OUTN, a drain terminal connected to the output node OUTP, and a source terminal connected to the VDD, wherein the output node OUTN and the output node OUTP are configured to output at least one oscillation signal;
   a fourth NMOS transistor coupled between the output node OUTN and VSS;
   a fifth NMOS transistor coupled between the output node OUTP and VSS, wherein base terminals of the fourth NMOS transistor and the fifth NMOS transistor are configured to receive a voltage control signal VCTRL;
   a first capacitor connected between the fourth NMOS transistor and VSS; and
   a second capacitor connected between the fifth NMOS transistor and VSS.

9. The voltage controlled oscillator of claim 8, further comprising:
   a third PMOS transistor having a base terminal configured to receive VCTRL and a source terminal connected to VDD;
   a first diode-connected PMOS transistor coupled between a drain terminal of the third PMOS transistor and the output node OUTN; and
   a second diode-connected PMOS transistor coupled between the drain terminal of the third PMOS transistor and the output node OUTP.

10. The voltage controlled oscillator of claim 8, further comprising a resistor connected between the output node OUTN and the output node OUTP.

11. The voltage controlled oscillator of claim 8, wherein an increase in the voltage amplitude of VCTRL is configured to decrease the frequency of the oscillation signal.

12. A voltage controlled oscillator, comprising:
   a converter comprising a first input INN, a second input INP, and an output FOUT, wherein the converter is configured to output an oscillation signal at the output FOUT;
   N serially connected delay cells, wherein N is an integer larger than 1, comprising:
      an Nth delay cell comprising a first output OUTN connected to the first input INN of the converter and a second output OUTP connected to the second input INP of the converter;
      an (N−1)th delay cell comprising a first output OUTN connected to the first input INN of the Nth delay cell and a second output OUTP connected to the second input INP of the Nth delay cell; and
      a first delay cell comprising a first output OUTN connected to the first input INN of the second delay cell and a second output OUTP connected to the second input INP of the second delay cell, the first delay cell further comprising a first input INN connected to the second output OUTP of the Nth delay cell and a second input INP connected to the first output OUTN of the Nth delay cell, wherein at least one of the N serially connected delay cells comprises:
         a first NMOS transistor having a base terminal configured to receive an input signal INP and a drain terminal connected to a first output OUTN associated with the one of the N serially connected delay cells;
         a second NMOS transistor having a base terminal configured to receive an input signal INN and a drain terminal connected to a second output OUTP associated with the one of the N serially connected delay cells;
         a third NMOS transistor having a source terminal connected to a low voltage supply VSS and a drain terminal connected to source terminals of the first NMOS transistor and the second NMOS transistor;
         a first PMOS transistor having a base terminal connected to the first output OUTP associated with the one of the N serially connected delay cells and a drain terminal connected to the second output OUTN associated with the one of the N serially connected delay cells; and
         a second PMOS transistor having a base terminal connected to the second output OUTN associated with the one of the N serially connected delay cells, and a drain terminal connected to the first output OUTP associated with the one of the N serially connected delay cells, wherein the output node OUTN and the output node OUTP associated with the one of the N serially connected delay cells are configured to output at least one oscillation signal.

13. The voltage controlled oscillator of claim 12, wherein the at least one of the N serially connected delay cells further comprises:
   a fourth NMOS transistor coupled between the output node OUTN and VSS, wherein the fourth NMOS transistor includes a base terminal configured to receive a voltage control signal VCTRL; and
   a first capacitor connected between the fourth NMOS transistor and VSS.

14. The voltage controlled oscillator of claim 13, wherein the at least one of the N serially connected delay cells further comprises:
   a fifth NMOS transistor coupled between the output node OUTP and VSS, wherein the fifth NMOS transistor includes a base terminal configured to receive a voltage control signal VCTRL; and
   a second capacitor connected between the fifth NMOS transistor and VSS.

15. The voltage controlled oscillator of claim 12, wherein the at least one of the N serially connected delay cells further comprises:
   a third PMOS transistor having a base terminal configured to receive a voltage control signal VCTRL and a source terminal connected to a high voltage supply VDD;

a first diode-connected PMOS transistor coupled between a drain terminal of the third PMOS transistor and the output node OUTN; and a second diode-connected PMOS transistor coupled between the drain terminal of the third PMOS transistor and the output node OUTP.

16. The voltage controlled oscillator of claim 12, wherein the third NMOS transistor in the at least one of the N serially connected delay cells includes a base terminal configured to receive an enable signal EN.

17. The voltage controlled oscillator of claim 12, wherein the delay time of each of the N delay cells is configured to vary in response to a voltage control signal VCTRL.

18. The voltage controlled oscillator of claim 17, wherein the frequency of the oscillation signal is configured to decrease in response to an increase in the voltage of VCTRL.

19. The voltage controlled oscillator of claim 17, wherein the frequency of the oscillation signal is configured to increase in response to an increase in the voltage of VCTRL.

* * * * *